United States Patent
Wilkins

(10) Patent No.: US 6,714,472 B2
(45) Date of Patent: Mar. 30, 2004

(54) DUMMY WORDLINE FOR CONTROLLING THE TIMING OF THE FIRING OF SENSE AMPLIFIERS IN A MEMORY DEVICE IN RELATION TO THE FIRING OF WORDLINES IN THE MEMORY DEVICE

(75) Inventor: James W. Wilkins, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/982,466

(22) Filed: Oct. 18, 2001

(65) Prior Publication Data

US 2002/0167858 A1 Nov. 14, 2002

(Under 37 CFR 1.47)

Related U.S. Application Data

(63) Continuation of application No. 09/513,761, filed on Feb. 25, 2000, now Pat. No. 6,388,931.
(60) Provisional application No. 60/121,573, filed on Feb. 25, 1999.

(51) Int. Cl.[7] ................................................. G11C 7/02
(52) U.S. Cl. ........................ 365/210; 365/194; 365/233
(58) Field of Search ................................. 365/210, 194, 365/233, 196, 214, 212

(56) References Cited

U.S. PATENT DOCUMENTS

| | | | | |
|---|---|---|---|---|
| 4,435,793 A | * | 3/1984 | Ochii | 365/233 |
| 5,031,151 A | | 7/1991 | Fifield et al. | |
| 5,075,571 A | | 12/1991 | Dhong et al. | |
| 5,241,506 A | * | 8/1993 | Motegi et al. | 365/210 |
| 5,245,584 A | | 9/1993 | Zampaglione et al. | |
| 5,282,176 A | | 1/1994 | Allen et al. | |
| 5,301,163 A | | 4/1994 | Reinschmidt et al. | |
| 5,418,756 A | | 5/1995 | McClure | |
| 5,452,252 A | | 9/1995 | Wada et al. | |
| 5,457,647 A | | 10/1995 | McClure | |
| 5,544,093 A | * | 8/1996 | Ogawa | 365/189.01 |
| 5,694,369 A | | 12/1997 | Abe | |
| 5,999,482 A | | 12/1999 | Kornachuk et al. | |
| 6,041,002 A | | 3/2000 | Maejima | |
| 6,115,303 A | | 9/2000 | Fister | |

* cited by examiner

Primary Examiner—Van Thu Nguyen
(74) Attorney, Agent, or Firm—TraskBritt

(57) ABSTRACT

A dummy wordline in a semiconductor memory controls the timing of the firing of sense amplifiers in the memory in relation to the firing of active wordlines in the memory. The dummy wordline receives a timing signal at the same time that an active wordline is fired, and the length of the dummy wordline is set during fabrication so the timing signal propagating along the dummy wordline arrives at the sense amplifiers and fires the sense amplifiers at a desired time.

12 Claims, 5 Drawing Sheets

DUMMY WORDLINE FOR CONTROLLING THE TIMING OF THE FIRING OF SENSE AMPLIFIERS IN A MEMORY DEVICE IN RELATION TO THE FIRING OF WORDLINES IN THE MEMORY DEVICE

CROSS-REFERENCE TO RELATED APPLICATIONS

This application claims the benefit of U.S. Provisional Application Ser. No. 60/121,573, filed Feb. 25, 1999, and is a continuation of U.S. application Ser. No. 09/513,761 filed Feb. 25, 2000, now U.S. Pat. No. 6,388,931.

BACKGROUND OF THE INVENTION

1. Field of the Invention

This invention relates in general to semiconductor memory devices, such as Static Random Access Memory (SRAM) devices. More specifically, the invention relates to dummy wordlines that control the timing of the firing of sense amplifiers in memory devices in relation to the firing of wordlines in the memory devices.

2. State of the Art

As shown in FIG. 1, a conventional SRAM (not shown in its entirety) includes wordline selection and driving circuitry 10 that initiates the process of reading a logic bit from an SRAM cell 12 when a timing control 14 causes the circuitry 10 to activate a wordline 16, thereby activating the SRAM cell 12. The activated SRAM cell 12 dumps its logic bit onto bitlines 18 and 20 by inducing a voltage differential between the bitlines 18 and 20 representative of the logic bit. The timing control 14 then causes a sense amplifier (not shown) in column selection and sensing circuitry 22 to sense and amplify the voltage differential between the bitlines 18 and 20. The amplified voltage differential, still representative of the logic bit output from the SRAM cell 12, is then output through output buffers (not shown) for use by external circuitry (not shown).

The timing of the "firing" (i.e., the activation) of the sense amplifier in the column selection and sensing circuitry 22 in relation to the firing of the wordline 16 is important. When the sense amplifier is fired too early, the activated SRAM cell 12 may not have sufficient time to induce a voltage differential on the bitlines 18 and 20 that can be sensed by the sense amplifier. As a result, the sense amplifier may incorrectly sense a logic "0" bit, for example, on the bitlines 18 and 20 while the SRAM cell 12 is in the process of dumping a logic "1" bit onto the bitlines 18 and 20. When the sense amplifier is fired too late, the SRAM cell 12 is no longer activated, so, again, the sense amplifier may sense the wrong logic bit on the bitlines 18 and 20. Even when the sense amplifier is fired in a "window" of time between "too early" and "too late," if the sense amplifier is fired toward the end of this window, time and power are wasted keeping the wordline 16 and the SRAM cell 12 activated until the end of the window. Thus, the sense amplifier is preferably fired in the beginning or the middle of the window of time between too early and too late in order to increase the speed with which logic bits are read from the SRAM cell 12 and to limit power usage.

Unfortunately, the timing control 14 does not always provide this preferred timing, because process variations during fabrication can vary the impedance-induced signal propagation delay along the wordline 16, and thus the timing of the activation of the SRAM cell 12, in a way that cannot be anticipated by the timing control 14. As a result, the timing control 14 is typically designed with extra delay time between the firing of the wordline 16 and the firing of the sense amplifier in the column selection and sensing circuitry 22 to correct for those wordline signal propagation delays that fall within a typical range. Although this approach creates a working part, it does not enhance the speed of the part or reduce its power usage, as is desired.

The timing problem described above also arises in Dynamic Random Access Memory (DRAM) devices, and it has been addressed in a DRAM device 24 shown in FIG. 2 manufactured by the Assignee of the present invention, Micron Technology, Inc. of Boise, Idaho. In the DRAM device 24, the timing of the firing of column selection and sensing circuitry 26 in relation to the firing of wordlines (not shown) in an array 28 of DRAM memory cells (not shown) by wordline selection and driving circuitry 30 is controlled by a folded delay line 32 fabricated in the periphery 34 of the DRAM device 24. The length of the delay line 32 is selected so a timing signal output by the circuitry 30 at the same time a wordline in the array 28 is fired propagates along the delay line 32 and arrives at the circuitry 26 in time to fire the circuitry 26 at the preferred time described above.

Again, process variations during fabrication vary the impedance-induced signal propagation delay of the folded delay line 32, and of the wordlines in the array 28, in such a way that the delay line 32 must include extra delay length to accommodate variations in the propagation delays that fall within a typical range, in much the same way that the timing control 14 of FIG. 1 must include extra delay time. As a result, the delay line 32 is not a reliable means of achieving the preferred timing described above, and thus does not reliably meet the goals of increased speed and reduced power usage.

Therefore, there is a need in the art for an improved device and method for controlling the timing of the firing of sense amplifiers and other column selection and sensing circuitry in memory devices, such as SRAMs and DRAMs, in relation to the firing of wordlines in such memory devices. Such an improved device and method should accommodate normal process variations that vary signal propagation delays in such memory devices while increasing speed and limiting power usage.

SUMMARY OF THE INVENTION

An apparatus in accordance with the present invention controls the timing of the firing of column selection and sensing circuitry, such as sense amplifiers, in a semiconductor memory, such as a Static Random Access Memory (SRAM) or a Dynamic Random Access Memory (DRAM). The apparatus includes a dummy wordline fabricated within an array of memory cells in the semiconductor memory. The dummy wordline has a length selected so the dummy wordline can delay a timing signal traversing its length by a selected amount of time before the timing signal fires the column selection and sensing circuitry.

By selecting a suitable length for the dummy wordline, the timing of the firing of the column selection and sensing circuitry can be controlled. Also, the dummy wordline preferably receives the timing signal from wordline driving circuitry at the same time the wordline driving circuitry fires an active wordline in the array of memory cells so the apparatus of the present invention controls the timing of the firing of the column selection and sensing circuitry in relation to the firing of active wordlines in the semiconductor memory.

Because the dummy wordline is fabricated within the array of memory cells, fabrication process variations alter the impedance characteristics of the dummy wordline in relatively the same way as they alter the impedance characteristics of active wordlines in the array. As a result, the time delay associated with the active wordlines varies in the same manner as the time delay associated with the dummy wordline, so no delay time need be built into the dummy wordline to accommodate variations in the time delay associated with the active wordlines. As a result, the length of the dummy wordline can be selected to optimize the timing of the firing of the column selection and sensing circuitry so it occurs at a preferred point in a window of time between too early and too late, thus reducing power usage by minimizing the active time of wordlines and increasing the speed of the semiconductor memory by optimizing the timing of its column selection and sensing circuitry.

In other embodiments of the present invention, a semiconductor memory, an electronic system, and a semiconductor wafer include the inventive dummy wordline described above.

In an inventive method of the present invention, the timing of the firing of column selection and sensing circuitry in a semiconductor memory is controlled by first generating a timing signal for firing the circuitry. Arrival of the timing signal at the column selection and sensing circuitry is then delayed by impeding conduction of the signal to the circuitry with impedance characteristics that are substantially the same as impedance characteristics of an active wordline traversing an array of memory cells in the semiconductor memory. The column selection and sensing circuitry is then fired using the delayed timing signal. As previously described, the timing signal is preferably delayed using a dummy wordline that traverses the array of memory cells of the semiconductor memory.

DETAILED DESCRIPTION OF THE ILLUSTRATED EMBODIMENTS

Figure 1:
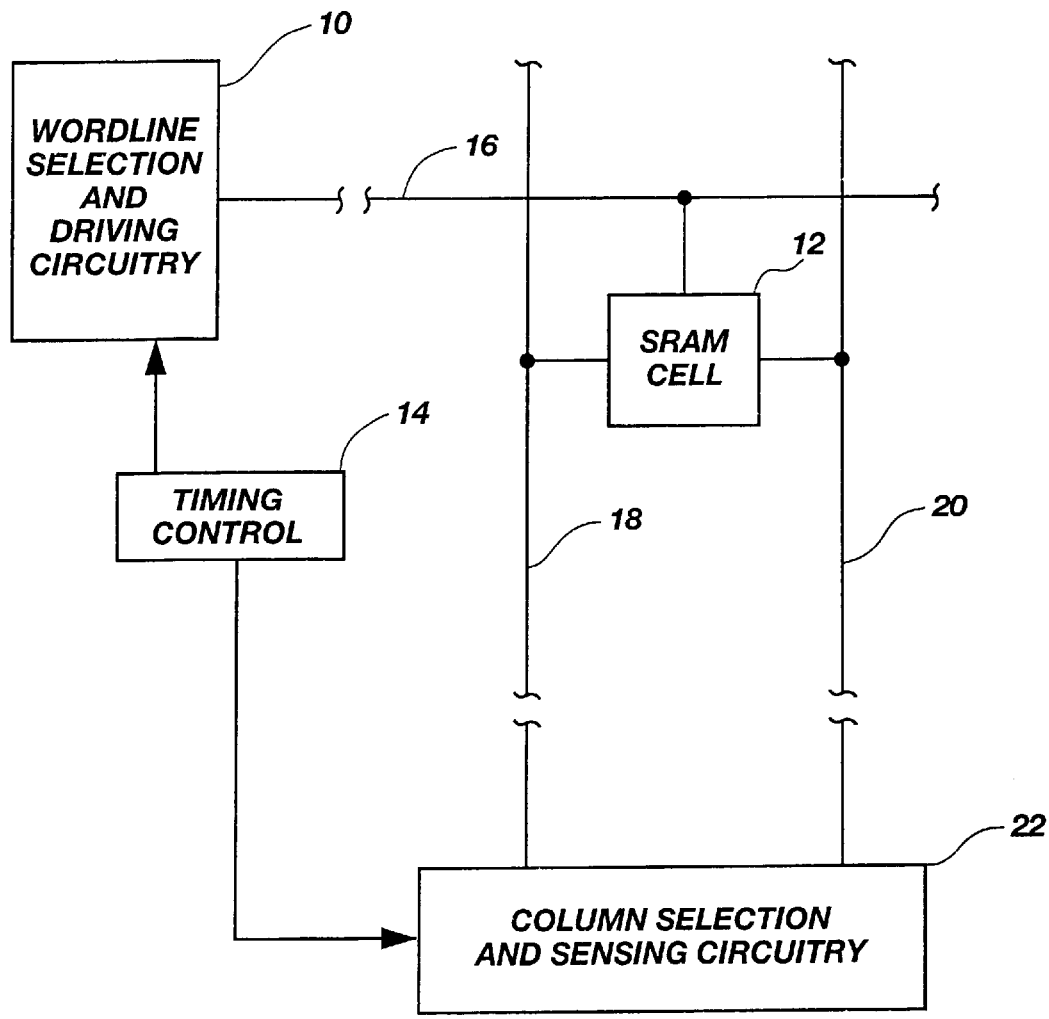
FIG. 1 is a block diagram of conventional circuitry for reading a logic bit from a Static Random Access Memory (SRAM) cell.
Figure 2:
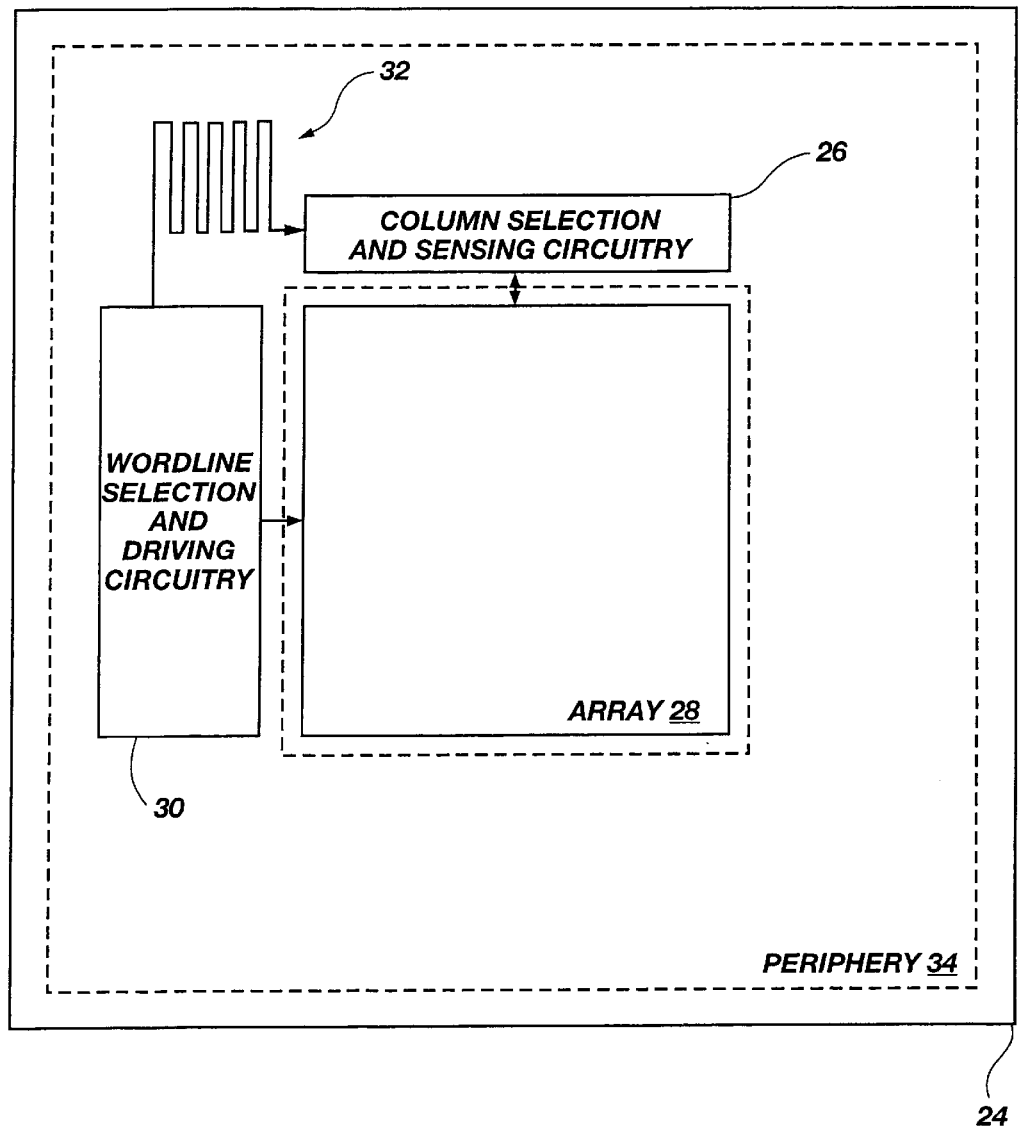
FIG. 2 is a block diagram of a known Dynamic Random Access Memory (DRAM) device that includes a folded delay line in the periphery of the device that controls the timing of the firing of column selection and sensing circuitry of the DRAM device.
Figure 3:
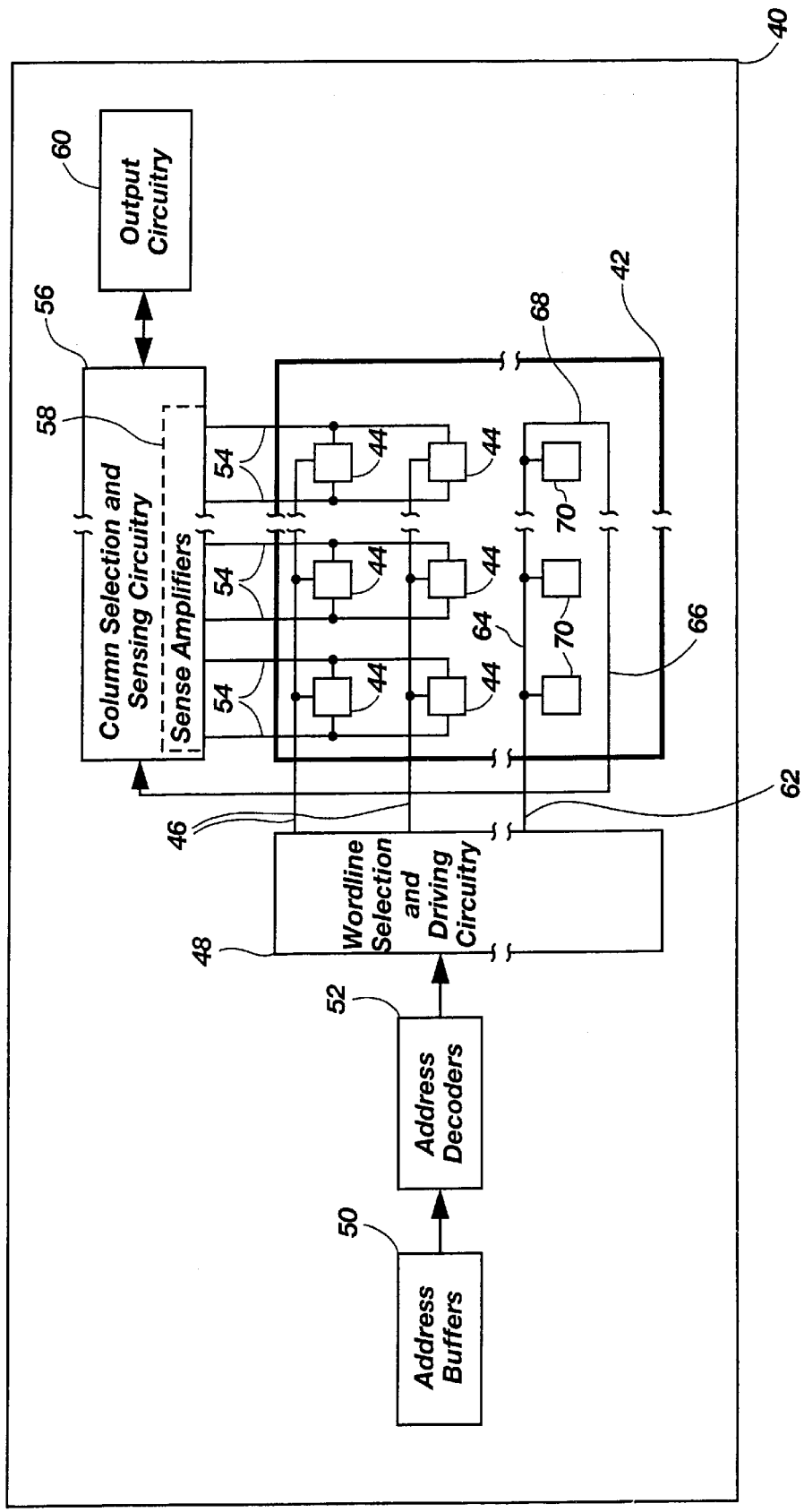
FIG. 3 is a block diagram of a semiconductor memory including a dummy wordline for timing the firing of sense amplifiers in the memory in relation to the firing of active wordlines in the memory in accordance with the present invention.

As shown in FIG. 3, a semiconductor memory 40 includes an array 42 of memory cells 44 activated by active wordlines 46 fired by wordline selection and driving circuitry 48 coupled to address buffers 50 and address decoders 52. A plurality of bitlines 54 communicates logic bits between the memory cells 44 and column selection and sensing circuitry 56 that includes sense amplifiers 58 and is coupled to output circuitry 60.

Although the memory cells 44 are each shown in FIG. 3 as being associated with a pair of the bitlines 54, as is typically the case when the memory cells 44 are Static Random Access Memory (SRAM) cells, the memory cells 44 may comprise any type of memory cell, including Dynamic Random Access Memory (DRAM) cells. Of course, only one of the bitlines 54 would typically be provided to the memory cells 44 if the cells 44 are DRAM cells.

In memory operations of the semiconductor memory 40, the process of reading a logic bit from one of the memory cells 44 begins with the wordline selection and driving circuitry 48 firing one of the active wordlines 46. At substantially the same time, the circuitry 48 also sends a timing signal down a dummy wordline 62 that is fabricated within the array 42 in substantially the same way as the active wordlines 46.

While the timing signal is propagating along the dummy wordline 62, the memory cells 44 connected to the active wordline 46 fired by the circuitry 48 activate and begin generating differential voltages on the bitlines 54 representative of their stored logic bits. Once these differential voltages are of sufficient magnitude to be sensed by the sense amplifiers 58, the timing signal that has been propagating along the dummy wordline 62 arrives at the column selection and sensing circuitry 56 and fires the sense amplifiers 58, thus allowing the amplifiers 58 to sense the differential voltages on the bitlines 54. A selected one of the logic bits represented by one of the sensed differential voltages is subsequently provided to the output circuitry 60 for use by external circuitry (not shown).

The timing of the arrival of the timing signal at the column selection and sensing circuitry 56 in relation to the firing of one of the active wordlines 46, and thus the timing of the firing of the sense amplifiers 58 in relation to the firing of one of the active wordlines 46, can be adjusted by adjusting the length of the dummy wordline 62. Preferably, the dummy wordline 62 includes first and second legs 64 and 66 connected by a shunt 68 positioned between the legs 64 and 66 so a conduction path through the first leg 66, the shunt 68, and the second leg 64 is of the necessary length for the timing signal to arrive at the circuitry 56 at the desired moment.

Although the shunt 68 is shown in FIG. 3 positioned at one end of the legs 64 and 66, it should be understood that it may be positioned anywhere between the legs 64 and 66 to achieve the desired length. Also, the dummy wordline 62 is shown in FIG. 3 in its preferred location near an edge of the array 42. This position allows the dummy wordline 62 to replace dummy cells 70 in their primary role within the array 42, which is to subject themselves to the edge effects common at the edge of an array so the memory cells 44 are not subject to those effects. However, it should be understood that the dummy wordline 62 need not be positioned near an edge of the array 42 to fall within the scope of the present invention.

Because the dummy wordline 62 traverses the same topography in the array 42 as the active wordlines 46, the signal propagation delays of both the dummy wordline 62 and the active wordlines 46 are subject to the same fabrication process variations. As a result, the respective signal propagation delays of the dummy wordline 62 and the active wordlines 46 change proportionally with respect to one another so no delay time is necessary to accommodate normal fabrication process variations, in contrast to the conventional timing mechanisms previously described.

Also, although the dummy wordline 62 can replace the dummy cells 70 in their primary role within the array 42, as described above, it is preferable that the dummy cells 70 be provided within the array 42 anyway so they may be activated by the dummy wordline 62 and thus load the dummy wordline 62 in the same way as the memory cells 44 load the active wordlines 46. This allows the dummy wordline 62 to more closely mimic the active wordlines 46.

Figure 4:
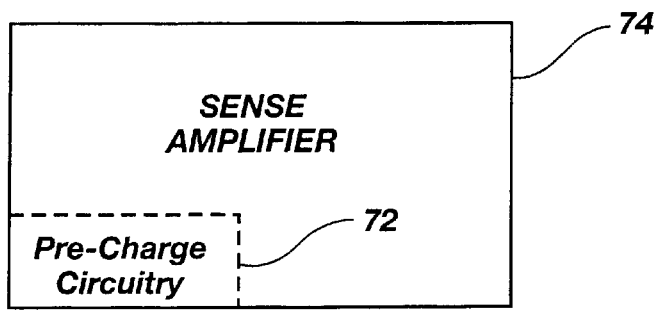
FIG. 4 is a block diagram of an alternative version of a sense amplifier of FIG. 3 in which the timing of the firing of pre-charge circuitry in the sense amplifier is controlled by the dummy wordline of FIG. 3.

As shown in FIG. 4 in an alternative version of the present invention, pre-charge circuitry 72 within a sense amplifier 74 from the semiconductor memory 40 of FIG. 3 may be fired by the timing signal rather than the sense amplifier 74 itself. It should be understood that although the timing signal is described with respect to FIG. 3 as firing the sense amplifiers 58 (FIG. 3), and although the timing signal is described with respect to FIG. 4 as firing the pre-charge circuitry 72, the present invention includes within its scope embodiments in which the timing signal fires any circuitry within the column selection and sensing circuitry 56 (FIG. 3).

Figure 5:
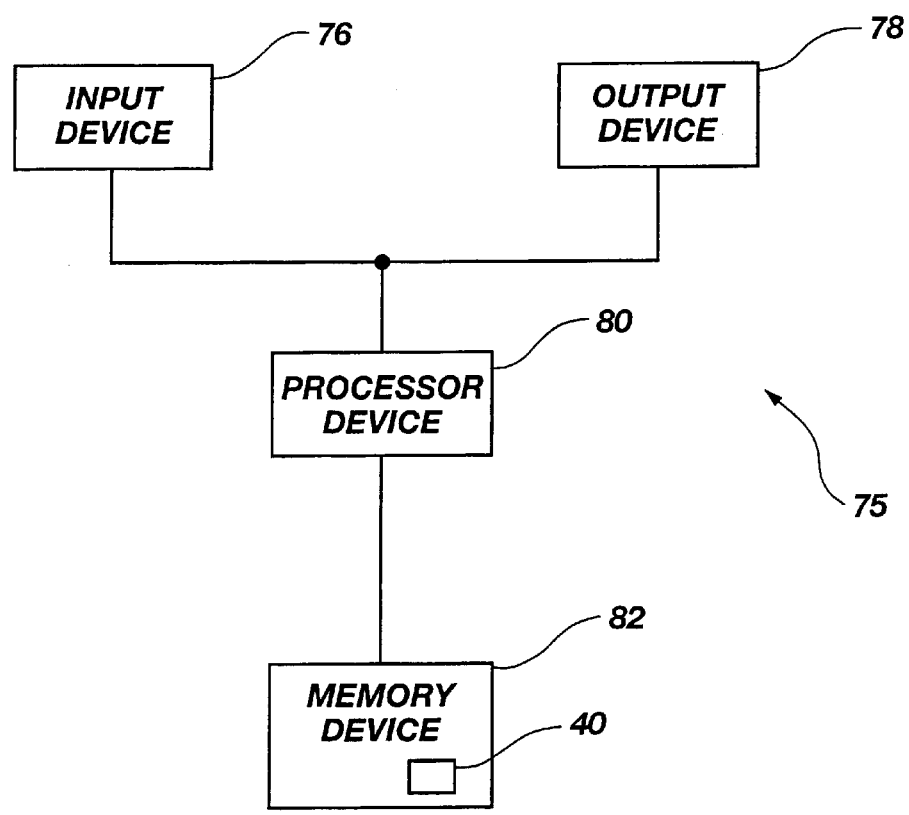
FIG. 5 is a block diagram of an electronic system incorporating the semiconductor memory of FIG. 3.
Figure 6:
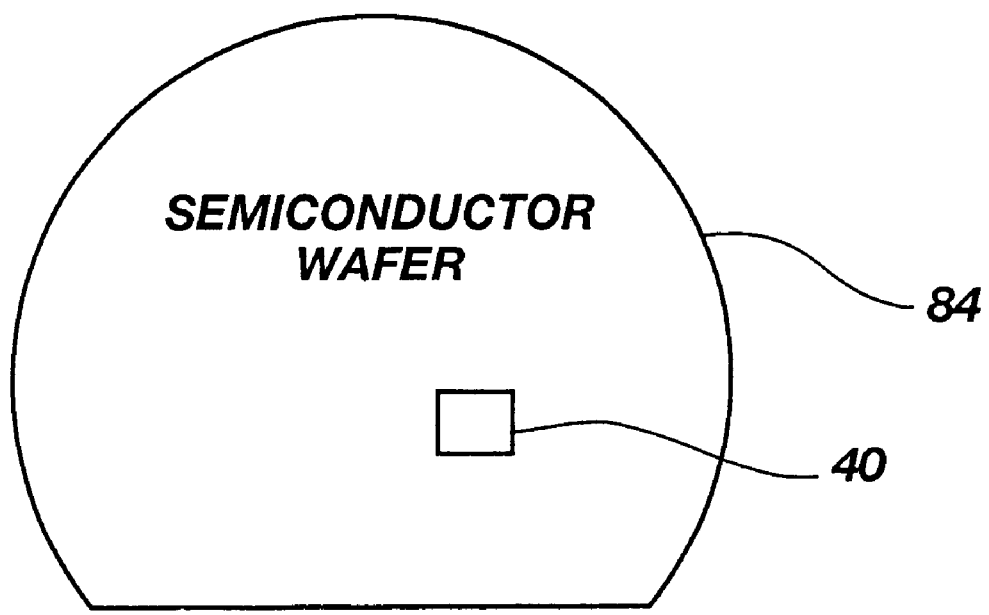
FIG. 6 is a diagram of a semiconductor wafer incorporating the semiconductor memory of FIG. 3.

As shown in FIG. 5, an electronic system 75 includes an input device 76, an output device 78, a processor device 80, and a memory device 82 incorporating the semiconductor memory 40 of FIG. 3. As shown in FIG. 6, a semiconductor wafer 84 incorporates the semiconductor memory 40 of FIG. 3.

Although the present invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method for controlling timing of a firing of column selection and sensing circuitry in a semiconductor memory, the method comprising:

generating a timing signal for firing the column selection and sensing circuitry;

delaying arrival of the timing signal at the column selection and sensing circuitry using a dummy wordline directly electrically coupled to the column selection and sensing circuitry and fabricated within an array of memory cells in the semiconductor memory, wherein the dummy wordline is fabricated near an edge of the array of memory cells; and firing the column selection and sensing circuitry using the delayed timing signal.

2. The method of claim 1, wherein delaying arrival of the timing signal comprises subjecting the timing signal to propagation delay characteristics along the length of the dummy wordline, the propagation delay characteristics along the length of the dummy wordline being substantially proportional to propagation delay characteristics along the length of at least one active wordline traversing the array of memory cells.

3. The method of claim 2, further comprising impeding conduction of the timing signal to the column selection and sensing circuitry by loading the dummy wordline substantially the same as the at least one active wordline.

4. The method of claim 3, wherein loading the dummy wordline comprises coupling at least one dummy memory cell to the dummy wordline.

5. The method of claim 1, further comprising selectively defining an amount of time by which the timing signal is delayed by coupling a shunt between a first leg and a second leg of the dummy wordline to define a length of the dummy wordline.

6. A method for isolating an array of memory cells within a semiconductor memory from edge effects, the method comprising fabricating a dummy wordline within the array of memory cells near an edge of the array, the dummy wordline configured to delay a timing signal at column selection and sensing circuitry of the semiconductor memory.

7. The method of claim 6, further comprising coupling at least one dummy memory cell to the dummy wordline.

8. An apparatus in a semiconductor memory for controlling timing of firing of column selection and sensing circuitry in the semiconductor memory, the apparatus comprising a dummy wordline fabricated within an array of memory cells in the semiconductor memory, wherein the dummy wordline is fabricated near an edge of the array of memory cells and directly electrically couples to the column selection and sensing circuitry.

9. The apparatus of claim 8, further comprising a plurality of active wordlines traversing the array of memory cells in the semiconductor memory, at least one of the plurality of active wordlines exhibiting substantially the same fabrication process variations as the dummy wordline.

10. The apparatus of claim 8, further comprising at least one dummy memory cell coupled to the dummy wordline.

11. The apparatus of claim 8, wherein the dummy wordline includes a first leg and a second leg coupled by a shunt selectively positioned between the first leg and the second leg to define a selected length for the dummy wordline to delay a timing signal traversing the dummy wordline by a selected amount of time before the timing signal fires the column selection and sensing circuitry.

12. The apparatus of claim 11, wherein the first leg and the second leg of the dummy wordline are substantially the same length as at least one active wordline in the array of memory cells.

* * * * *